United States Patent [19]

Hennig

[11] Patent Number: 5,126,673
[45] Date of Patent: Jun. 30, 1992

[54] METHOD FOR GENERATING A SEQUENCE OF SPIN ECHO SIGNALS, THE APPLICATION OF THIS METHOD IN NUCLEAR SPIN TOMOGRAPHY, AND A DEVICE FOR CARRYING OUT AND/OR FOR APPLYING THIS METHOD

[75] Inventor: Jürgen Hennig, Freiburg, Fed. Rep. of Germany

[73] Assignee: Spectrospin AG, Switzerland

[21] Appl. No.: 490,679

[22] PCT Filed: Jul. 5, 1989

[86] PCT No.: PCT/DE89/00441

§ 371 Date: Mar. 8, 1990

§ 102(e) Date: Mar. 8, 1990

[87] PCT Pub. No.: WO90/00743

PCT Pub. Date: Jan. 25, 1990

[30] Foreign Application Priority Data

Jul. 9, 1988 [DE] Fed. Rep. of Germany ....... 3823398

[51] Int. Cl.⁵ ............................................. G01R 33/20
[52] U.S. Cl. .................................................... 324/309
[58] Field of Search ............... 324/309, 307, 300, 306, 324/311, 313

[56] References Cited

U.S. PATENT DOCUMENTS

| | | | |
|---|---|---|---|
| 4,684,891 | 8/1987 | Feinberg .......................... | 324/309 |
| 4,733,186 | 3/1988 | Oppelt et al. ..................... | 324/309 |
| 4,742,301 | 5/1988 | van der Meulen et al. ........ | 324/309 |
| 4,820,984 | 4/1989 | Kuhn et al. ....................... | 324/309 |

FOREIGN PATENT DOCUMENTS

| | | |
|---|---|---|
| 0191431 | 2/1986 | European Pat. Off. . |
| 0238139 | 3/1987 | European Pat. Off. . |
| 0259935 | 9/1987 | European Pat. Off. . |
| 2928551 | 7/1979 | Fed. Rep. of Germany . |
| 3445689 | 12/1984 | Fed. Rep. of Germany . |
| 3504734 | 2/1985 | Fed. Rep. of Germany . |
| 3518950 | 5/1985 | Fed. Rep. of Germany . |
| 3742490 | 12/1987 | Fed. Rep. of Germany . |

OTHER PUBLICATIONS

US-Z: "The Journal of Chemical Physics", vol. 34, No. 6, 1961, pp. 2057-2060.
US-Z: "The Journal of Chemical Physics" vol. 60, No. 8, 1974, pp. 2966-2970.
IEEE Transactions on Medical Imaging, Band MI-6, No. 2, Jun. 1987, pp. 157-164.
Journal of Magnetic Resonance, vol. 78, No. 3, Jul. 1988, pp. 397-407.

*Primary Examiner*—Hezron E. Williams
*Assistant Examiner*—Louis M. Arana
*Attorney, Agent, or Firm*—Walter A. Hackler

[57] ABSTRACT

A method and drive for generating spin echo signals by a sequence of equidistant rf pulses of different amplitude and small flip angle $\alpha$, which pulses follow each other in very rapid succession. By proper selection of the amplitude, it is ensured that the sequence of equidistant echo signals so obtained has of an image without numerous gradient switching steps heretofore required.

13 Claims, 6 Drawing Sheets

METHOD FOR GENERATING A SEQUENCE OF SPIN ECHO SIGNALS, THE APPLICATION OF THIS METHOD IN NUCLEAR SPIN TOMOGRAPHY, AND A DEVICE FOR CARRYING OUT AND/OR FOR APPLYING THIS METHOD

BACKGROUND OF THE INVENTION

The present invention relates to a method for generating a sequence of spin echo signals in NMR spectroscopy, in which a sample placed in a homogeneous magnetic field is excited by a sequence of rf pulses resulting in the generation of spin echo signals.

There have been known several methods for generating spin echo signals. However, it is common to all these methods, that they include measures intended to reverse the induction decay occurring as a result of dephasings of the excited spins, due to inhomogeneities of the magnetic field, so as to achieve a new signal by corresponding rephasing. A typical example to be mentioned in this connection is the Carr-Purcell pulse sequence where a 90° excitation pulse is followed by a number of 180° pulses which have a rephasing effect and the result that a spin echo signal occurs after every 180° pulse. By adding up the spin echo signals, it is now possible to achieve a considerable improvement of the signal-to-noise ratio. A similar effect can be achieved also by switching gradient fields between the spin echo signals. It has also been known to make use of such methods for generating a sequence of spin echo signals in nuclear spin tomography, and to give the individual spin echo signals different codings so that in the extreme case a single sequence of spin echo signals will be sufficient to obtain the signals required for producing a two-dimensional image.

However, the known methods for generating a sequence of spin echo signals are connected with the drawback that they are still very time-consuming because the occurrence of the individual spin echo signals is separated by the switching processes necessary for the interposition of the gradient fields and because these processes require a finite period of time. Although it would be possible, technically, to switch gradients so rapidly that the method known from DE-A 34 34 161 would permit the generation of an image in a few milliseconds, such measuring sequences are suited only for the generation of a sequence of only a few images as it is an inherent feature of such sequences that they result in extreme mechanical stresses for the measuring system and— as a result thereof—in an extreme noise level which would be unacceptable for the patient. Switching gradients at such extreme speeds would in addition lead to conditions where the limit values admissible for examinations of patients would be exceeded by far.

Consequently, it is not possible with the aid of these techniques to generate a continuous sequence of cross-sectional images—similar to the ultrasound process, for example.

SUMMARY OF THE INVENTION

Now, it is the object of the present invention to provide a method for generating a sequence of spin echo signals in NMR spectroscopy, where the spin echo signals occur at very short intervals, permitting the observation of rapid processes, and this the more as the individual spin echo signals can be precoded in a simple manner with the parameter to be observed.

This object is achieved according to the invention by the fact that the sample is exposed additionally to a magnetic gradient field and that for exciting the sample a sequence of equidistant rf pulses of different amplitude with a small flip angle $\alpha$ is used, which pulses follow each other in rapid sequence and whose flip angle $\alpha$ and amplitude are selected in such a manner that the product of the number of rf pulses and the flip angle by the individual pulses leads to an overall flip angle of between 90° and 180° and that, following the sequence of rf pulses, a train of equidistant echo signals of an amplitude as constant as possible is obtained.

The invention, therefore, makes use of the known phenomenon that a sequence of rf pulses rapidly following each other produces also a sequence of echo signals rapidly following each other, which phenomenon has been described, for example, by Kaiser et al. in J. Chem. Phys. 60, 2966 (1974). To this day, however, only few echo signals with rapidly decreasing amplitude have been observed, which appeared as interfering signals in the recorded spectra so that one has tried to find means and ways to avoid such echo signals. There have never been seen heretofore means or ways to make use of such echo signals as useful signals. This possibility has been opened up only by the present invention which ensures, by the application of a magnetic gradient field and the use of rf pulses of different amplitude, that a large number of spin echo signals is obtained which have an amplitude as constant as possible and which can be evaluated in a useful manner. It should be noted in this connection that even the decrease of the amplitude of the echo signals to one fourth of their initial amplitude is not regarded as very disturbing, in particular when the method is used for the generation of images, and is still regarded as fulfilling the condition that the amplitude of the echo signals should be as constant as possible.

It is a particular advantage of the method according to the invention that the magnetic gradient field can be used for precoding an interesting parameter, in particular the distribution in density of the excited spins in the direction of the gradient. The gradient may be constant during the full period of the pulse burst formed by the sequence of rf pulses, and the subsequent sequence of echo signals. However, there is also the possibility to vary the intensity of the magnetic gradient field during the time interval between the sequence of rf pulses and the beginning of the echo signal sequence. An increase of the magnetic gradient will lead to a reduction of the time interval between the echo signals relative to the time interval between the rf pulses and, consequently, to a reduction of the read-out time. On the other hand, reducing the magnetic gradient field will correspondingly lead to an increase of the time interval between the echo signals and, consequently, an extension of the total measuring time, but result in an improvement of the signal-to-noise ratio, due to the smaller band width of the recorded data. Therefore, the one or the other variant of the method may be of practical interest, depending on the application of the method according to the invention.

The sequence of rf pulses need not be uninterrupted; rather, it is absolutely possible to generate a sequence of equidistant rf pulses which are interrupted by gaps at predetermined points, without having to accept corresponding gaps in the sequence of echo signals. This makes it possible to reduce the total energy impacting upon the sample through the sequence of rf pulses, which may be an advantage in certain cases. On the other hand, however, the total energy of the echo signals will also be reduced correspondingly so that the demands placed on the amplitude of the echo signals set limits to the reduction in density of the sequence of the rf pulses. Besides, a sequence of rf pulses including gaps requires a variation of the amplitude of the rf pulses different from that necessary for a sequence without gaps.

It has been found that in addition to the amplitude the phase of the carrier signal of the rf pulses is also of importance for the amplitude of the echo signals. It is, therefore, provided according to a further improvement of the invention that the rf pulses are phase-modulated in addition. A sequence where the phase of half of the rf pulses is phase-shifted by 90° relative to the phase of the second half of the rf pulses leads, for example to an extension of the sequence of the echo signals.

As has been mentioned before, the echo signals produced by the method according to the invention may be used also for the generation of images in NMR tomography. In this case, coding in the gradient direction is achieved by the magnetic gradient field, and the latter corresponds to the read gradient normally employed in NMR tomography. Consequently, the present invention also relates to the use of the method described above for the generation of images. According to this method, the signals characteristic of the points of a two-dimensional image can be gained in a particularly favorably manner by the steps of exposing the sample additionally, after termination of the sequence of rf pulses and for the duration of the sequence of the echo signals, to a magnetic phase gradient directed perpendicularly to the magnetic gradient field, and subjecting the echo signals so obtained to two-dimensional Fourier transformation which then provides the signals characteristic of the points of the image.

The application of the method according to the invention for the purpose of generating the signals characteristic of the points of a two-dimensional image enables images to be generated in nuclear spin tomography within a very short period of time. In addition, the use of rf pulses with very small flip angles has the effect that a very important part of the magnetization of the sample remains in the range of thermal equilibrium which also enables the sequences to be repeated very rapidly. The method according to the invention, therefore, is the first to provide the possibility to generate images in very rapid succession permitting film-like representations and, accordingly, the observation of moving processes in the sample. As, in addition, neither the read gradient nor the phase gradient have to be switched during the sequence of echo signals and, in addition, the rf energy irradiated during any measuring sequence remains very low, all preconditions are fulfilled to enable such images to be made on human bodies for the purpose of observing the function of human organs. This opens up new chances for real time monitoring of a kind which was heretofore possible only with the aid of ultrasound systems.

As has been mentioned before, the phase gradient may be constant during the sequence of the echo signals as a constant phase gradient leads to monotonously increasing dephasing of the echo signals. This admittedly results in certain imaging errors, but these remain negligible when a sufficiently large data matrix is employed. The advantage resides in the fact that the phase gradient need not be switch during the recording time, that switching can be effected relatively slowly during the interval between the end of the sequence of the rf pulses and the beginning of the sequence of the echo signals, and that the intensity of the phase gradient may be small, due to its accumulating effect. Consequently, switching of the phase gradient will not mean a strain for a patient being examined by nuclear spin tomography.

However, there also remains the possibility to avoid image errors resulting from a constant phase gradient by switching on the phase gradient in a pulse-like manner in the intervals between the individual echo signals. This permits direct data logging in an orthogonal matrix. As here, again, the phase coding gradient may be very weak, rapid switching of the phase gradient between the echo signals does not present any difficulties and does not lead to heavy strains on the patient, either.

Besides, when using the method according to the invention for generating images in nuclear spin tomography, it is also possible to make use of the disk-selection methods generally known from nuclear spin tomography, and there is further the possibility to develop the two-dimensional method to a three-dimensional method. For example, the sample may be exposed, before irradiation of the sequence of rf pulses, to a disk-selection gradient and a selective excitation pulse, whereafter the sequence of the rf pulses will have the effect of a refocusing pulse. Alternatively, the sample may be subjected, prior to irradiation of the sequence of the rf pulses, to a disk-selection gradient and an rf pulse, which would saturate the area of the sample positioned outside the selected disk so that only the spins remaining within the undisturbed disk would respond to the method according to the invention. As a still further alternative, it would be possible to irradiate upon the sample, after termination of the sequence of rf pulses and before the beginning of the sequence of echo pulses, a disk-selective refocusing pulse and to replace the magnetic gradient field by the selection gradient for the duration of the refocusing pulse.

For recording the third dimension, it is possible either to employ the methods of three-dimensional Fourier transformation in an analogous manner, or else to repeat the steps serving to generate the signals characteristic of the points of a two-dimensional image for a desired number of closely adjacent disks.

Finally, the present invention relates to a device for carrying out the method according to the invention and/or for its application for the generation of images. Just as the known devices, the device according to the invention also comprises a transmitter designed for generating rf pulses, except that the transmitter used according to the invention must be adapted for generating very rapid sequences of equidistant rf pulses with amplitudes and, under certain circumstances, phases varying from pulse to pulse.

BRIEF DESCRIPTION OF THE DRAWINGS

The invention will now be described and explained in more detail with reference to the diagrams represented in FIGS. 1 to 6. The features that can be derived from the specification in conjunction with the diagrams may be employed for the plurality of possible variants of the method according to the invention and its application, either individually or in any desired combination thereof.

DETAILED DESCRIPTION

Figure 1:
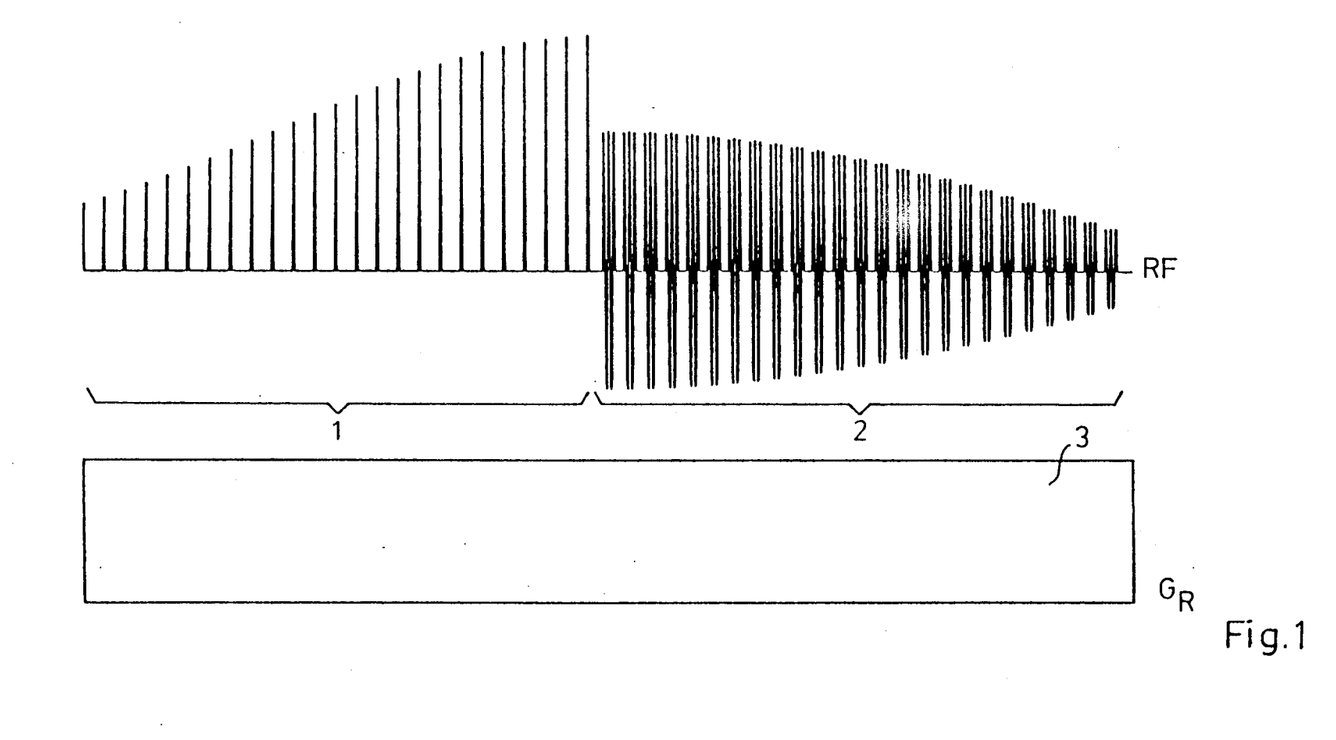
FIG. 1 illustrates the basic sequence of the method of the present invention.

FIG. 1 illustrates the basic sequence of the method according to the invention. As appears from FIG. 1, the amplitude of the rf pulses is modulated in such a manner that it increases as the pulse burst progresses. One obtains in this manner a larger number of echo signals with only slowly decreasing amplitude. The amplitude variation of the rf pulses can be calculated by means of the equations (9) and (10) published by D. E. Woessner in J. Chem. Phys. 34, 2057 (1961).

$$F(t+t_w) = F(t)\cos^2\tfrac{1}{2}\theta + F^*(t)\sin^2\tfrac{1}{2}\theta - M_z(t)\sin\theta$$

and $$M_z(t+t_w) = M_z(t)\cos\theta - \tfrac{1}{2}[F(t) - F^*(t)]\sin\theta.$$

wherein $\theta = \omega t_w$; $\omega = \gamma H_1$.

In the above equation, $\gamma$ is the nuclear gyromagnetic ratio, $H_1$ the amount of the effectively rotating component of the rf field, $t_w$ the duration for which the rf field is applied, F the rotating component of the nuclear magnetization and $M_z$ the longitudinal magnetization.

Although a sequence of echo signals of equal amplitude can be generated only for an excitation flip angle approaching 0°, which lead to unsuitably small signal amplitudes, a good compromise between a sufficiently great amplitude and sufficient constancy of the amplitude can be achieved also for a signal intensity sufficiently high for measuring purposes.

The excitation sequence 1 consists of a sequence of a plurality of rf pulses which is also described as pulse burst. The sequence comprises preferably 64, 128 or 256 rf pulses of a rectangular excitation profile and a typical length of 1 to 20 μs. The pulses have different amplitudes and a typical flip angle of 0.1° to 2°. They follow each other at constant intervals. The typical interval between the rf pulses is 50 to 1000 μs. After termination of the pulse burst 1, the represented sequence of echo signals 2 is formed. The sequence of pulse burst 1 and of echo signals 2 occurs under a magnetic gradient field 3 which is constant in time and which may be described also as read gradient $G_R$.

It should be noted here that the rf pulses of the pulse burst represented in FIG. 1 need not be present in uninterrupted succession. The term "equidistant pulse sequence" as used in this connection means a pulse sequence where the individual pulses occur at equal intervals, but may have very different amplitudes, including the amplitude zero which means that a pulse may be omitted from the pulse sequence. The before-mentioned publication describes that a small number of rf pulses may already result in the generation of a very great number of echoes. Consequently, it is absolutely possible to omit a lesser or greater number of rf pulses from the sequence of generally equidistant rf pulses forming the pulse burst 1. The number of rf pulses can be minimized by varying the interval between the rf pulses corresponding to the sequence 1, 3, 5, 9, 17, ..., n with $n = 2^{n-1} + 1$, so that the rf pulses are transmitted only at the moments 0, 1, 4, 9, 18, 35, etc., the moments defining integral multiples of the interval between the equidistant echo signals. However, such a sequence does not permit to achieve a monotonous variation of the amplitude of the echo signals, not to speak of an equal—or only approximately equal—amplitude level. Other possibilities consist in omitting only individual rf pulses or groups of rf pulses. A simple possibility can be derived from the observation that the number of echo signals remains constant even when no rf signals at all are encountered during the medium third of the pulse burst. Such an operation can be applied successively to the remaining packages of rf pulses. By applying this "blanking" operation several times to parts of the whole pulse burst one obtains a very large number of possible pulse bursts, it being necessary, however, to optimize the amplitude modulation of the rf pulses anew for each of the sequences in order to obtain optimally equal amplitudes of the echo signals. The calculation of the signal amplitude reveals in this connection that a pulse burst consisting of an uninterrupted sequence of rf pulses can be optimized, as regards the constancy of amplitude of the echo signals, much more easily than a sequence of rf pulses which is interrupted by gaps. Finally, it should be noted in this connection that any pulse burst may be inverted in time although in this case, too, the amplitudes have to be calculated anew.

Figure 2:
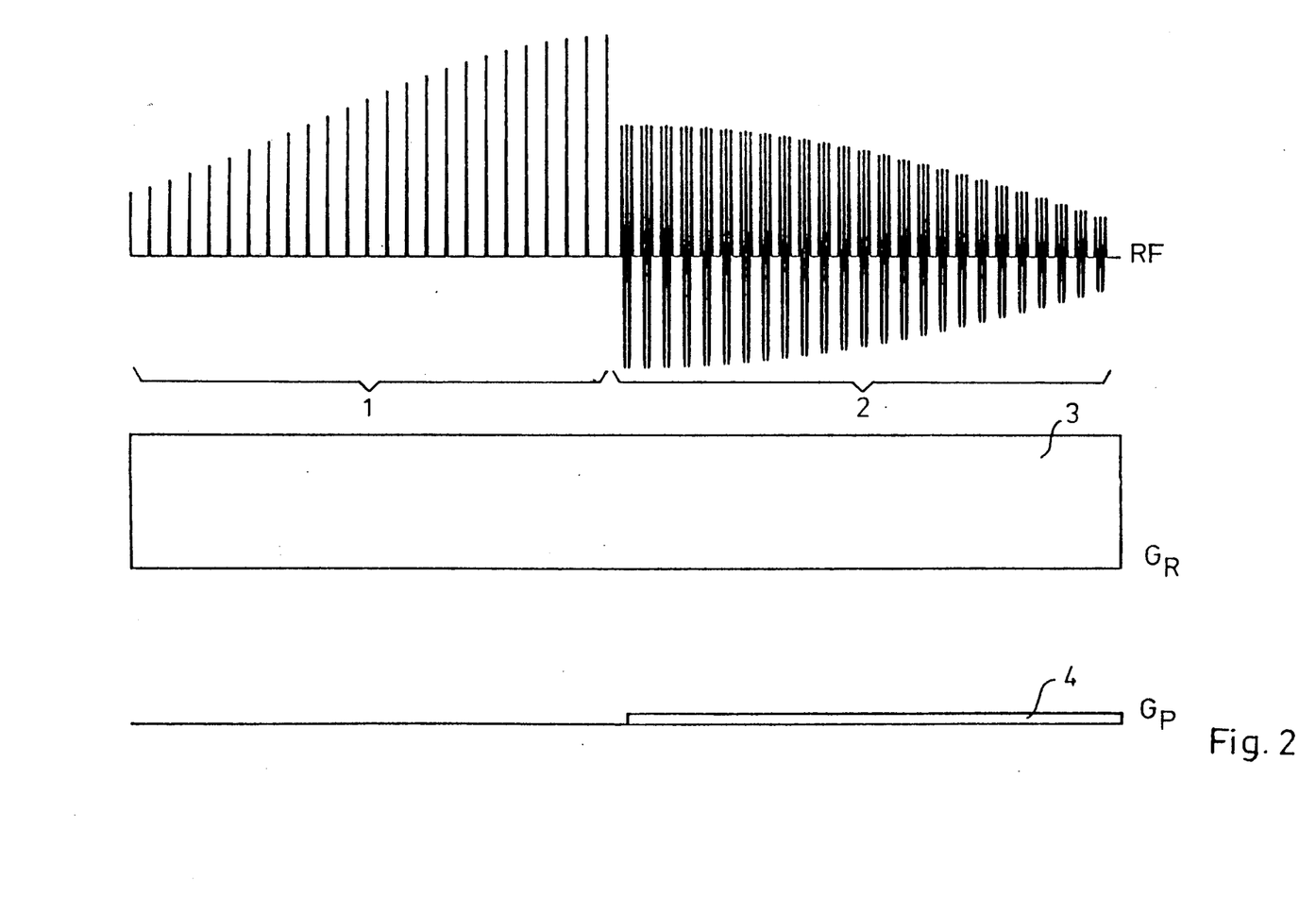
FIG. 2 illustrates the sequence of phase gradient application.

The basic sequence according to the invention may be employed in many different ways. A particularly advantageous application is that for imaging purposes as it enables images to be generated very quickly. The magnetic gradient field 3 is used in this case as read gradient $G_r$, for precoding a first direction in space. Precoding of the second direction in space may be effected, in the most simplest of all cases, by the application of a second gradient in a geometrical direction perpendicular to the read gradient $G_R$, the intensity of the second gradient, which is described also as phase gradient $G_p$, being derived from the quotient of the intensity of the read gradient $G_r$ and the number of echo signals read out. As illustrated in FIG. 2, the phase gradient 4 is applied only after termination of the pulse burst 1, and is then maintained constant for the duration of the sequence 2 of the echo signals. The phase gradient 4 effects constant dephasing of the echo signals produced so that an image can be reconstructed directly from these echo signals, by two-dimensional Fourier transformation.

The 2DFT reconstruction algorithm employed for generating the image signals is based on the process of scanning the Fourier space (k-space) line by line, with constant dephasing of all lines. In the case of the method illustrated by FIG. 2, the data dots are dephased in a monotonously increasing manner, due to the presence of a phase gradient remaining constant during acquisition, and this dephasing leads to imaging errors in the form of oblique image lines. However, the errors resulting from this fact are negligible if a sufficiently large data matrix is used. If the data matrix has at least $32 \times 32$ image dots or more, the described imaging errors may be regarded as negligible. It would of course be possible also to achieve faultless image reconstruction, by suitable adaptation of the reconstruction algorithm to the particular manner in which the k-space is scanned. This could be achieved by interpolation of the data in the time domain relative to an orthogonal matrix, prior to the two-dimensional Fourier transformation. However, the computing time required for this purpose would cancel out the advantages resulting from the imaging rapidity rendered possible by the invention.

Figure 3:
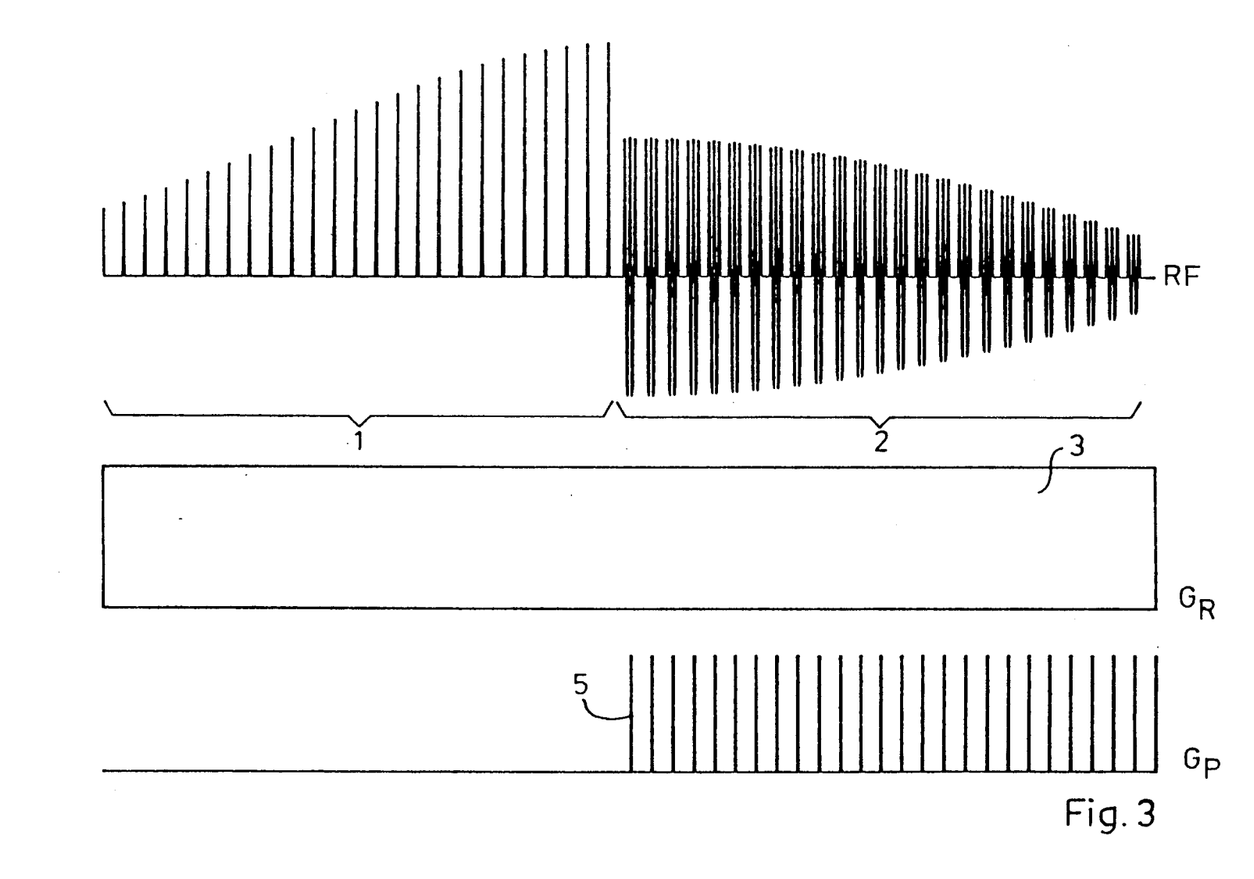
FIG. 3 illustrates the application of a non-constant phase gradient in accordance with the method of the present invention.

In fact, however, direct data logging in an orthogonal matrix is also possible if a non-constant phase gradient is used, as illustrated by the diagram of FIG. 3. It will be seen that in the case of the method illustrated by FIG. 3, the constant phase gradient 4 according to FIG. 2 has been replaced by a sequence of very short phase-coding pulses 5 which are switched on between each pair of echo signals 2. Switching on the phase-coding pulses does not present any problems because these gradient pulses have a very small amplitude only.

The 2D methods illustrated by FIGS. 2 and 3 may be extended to a 3D process by spatial precoding in a third direction perpendicular to the directions of the read gradient $G_R$ and the phase gradient $G_P$ and application of three-dimensional Fourier transformation. There are then possible all of the different paths through the three-dimensional k-space known from the 3D methods.

Figure 4:
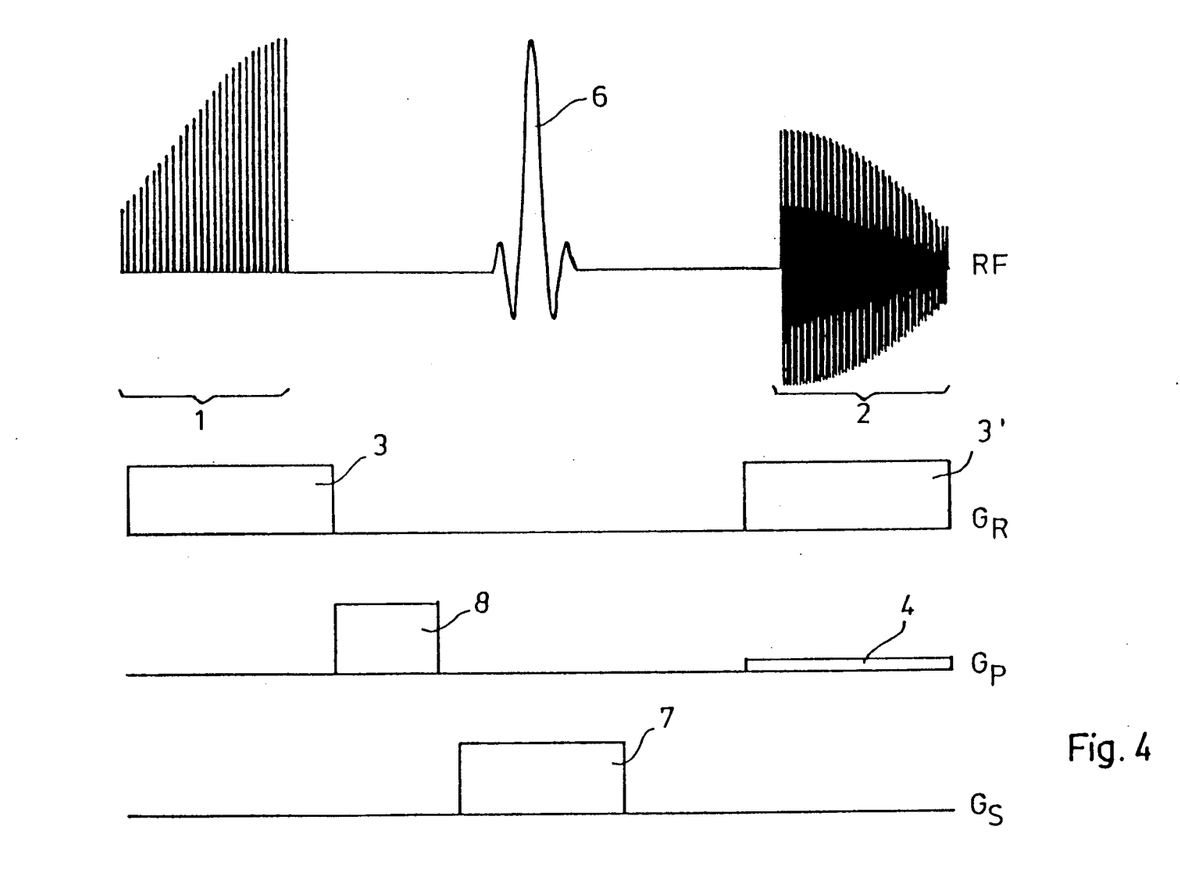
FIG. 4 illustrates the use of a disk-selection rf pulse in accordance with the present invention.

However, there is also the possibility to combine the 2D method described by way of FIGS. 2 and 3 with the disk-selection process usual in nuclear spin tomography. In fact, the method according to the invention may be employed in combination with an additional disk-selective pulse which may be irradiated, in the usual manner, under a constant selection gradient $G_S$, in the form of an amplitude-modulated or phase-modulated rf pulse with small spectral band width. As illustrated in FIG. 4, a disk-selective rf pulse may be irradiated upon the sample as a refocusing pulse while the e selection gradient 7 is prevailing, after the read gradient 3 has been switched off. The refocused sequence 2 of the echo signals is then received, after a certain additional time, when the read gradient 3' has been switched on again. The phase gradient 4 may then be present during reception of the echo signals 2 either constantly or intermittently, as illustrated in FIG. 3. By switching on an additional gradient pulse 8 before the refocusing pulse 6, the phase-coding zero point may then be shifted by the phase gradient 4 to the middle of the sequence of echo signals 2.

Figure 5:
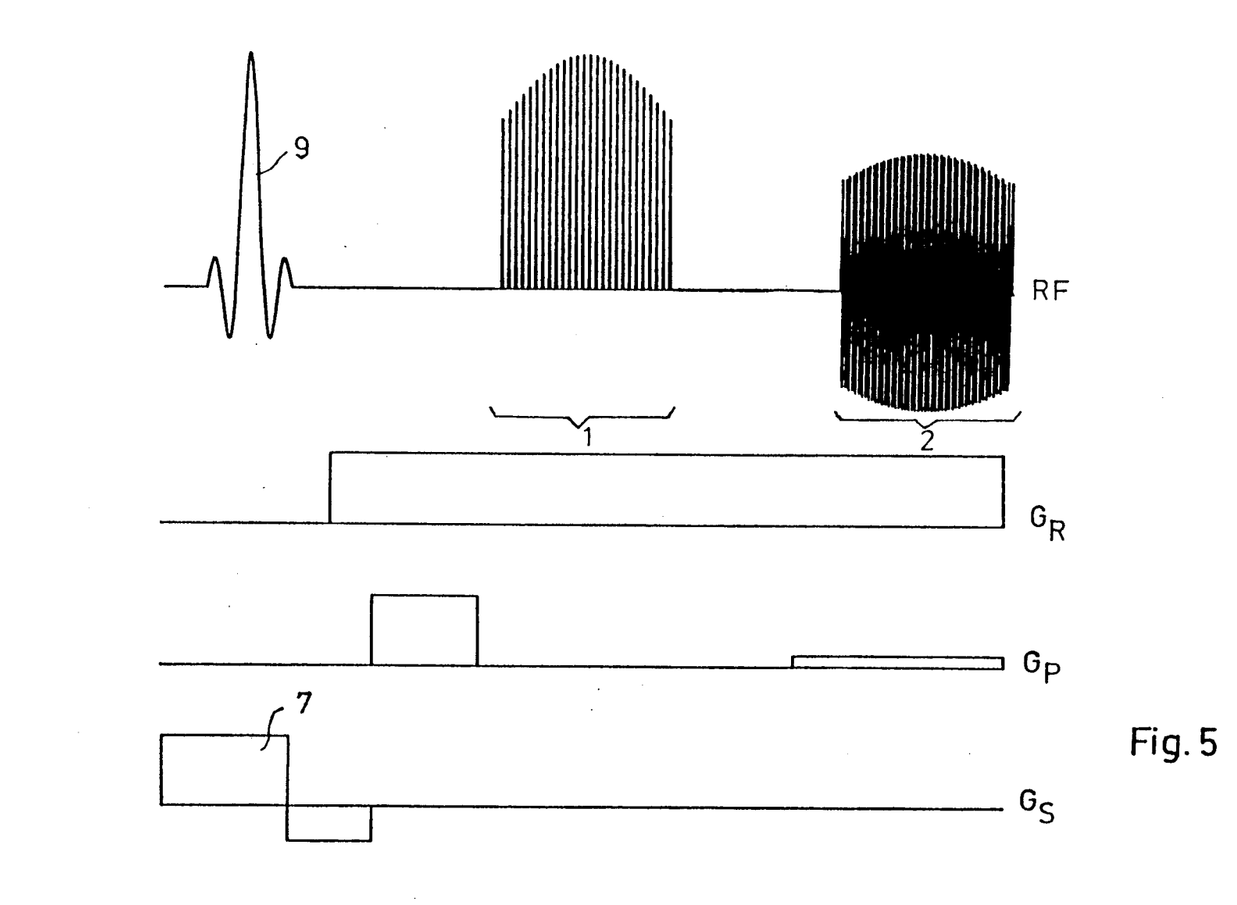
FIG. 5 illustrates an alternative disk-selection rf pulse application.

As appears from FIG. 5, a disk-selection rf pulse 9 may be applied to the sample also prior to irradiating the sequence 1 of rf pulses with standing selection gradient 7. In this case, the sequence 1 of the rf pulses will then act in the manner of a refocusing pulse so that the sequence 2 of the echo pulses will appear, relative to the sequence 1 of the rf pulses, at an interval corresponding to the interval between this sequence 1 and the selection pulse 9.

It should be noted in this connection that a third disk-selection possibility consists in suppressing the signal from those areas of the sample which does not belong to the disk under observation. This can be achieved by the processes known from NMR tomography, in particular by applying a sandwich pulse which has the effect that following this pulse the selected disk will have assumed the condition of pure z magnetization, while the area outside the selected disk has been transferred to a condition of transversal magnetization. The application of the methods illustrated by FIGS. 2 and 3, therefore, results in the generation, immediately following this sandwich pulse, of signals exclusively in that volume of the disk which has been restored to the condition of pure z magnetization. In a similar manner, it can be ensured also, by application a volume-selective saturation pulse prior to execution of the methods illustrated in FIGS. 2 and 3, that signals will be obtained only from the selected disk.

In order to determine a pulse burst by calculation, one can also proceed from a new theoretical approach according to which the total magnetization of a spin ensemble is no longer resolved into the elementary components of the transversal magnetizations $M_x$ and $M_y$ and the longitudinal magnetization $M_z$, but is instead broken up into complex subensembles $F_n$ and $Z_n$ of magnetization vectors, with $F_n$ constituting subensembles of transversal magnetization and $Z_n$ constituting subensembles of z magnetization. Each subensemble $F_n$ may be described as a complex sum of vectors of transversal magnetization as follows:

$$F_n = \Sigma(M_x + M_y)$$

Figure 6:
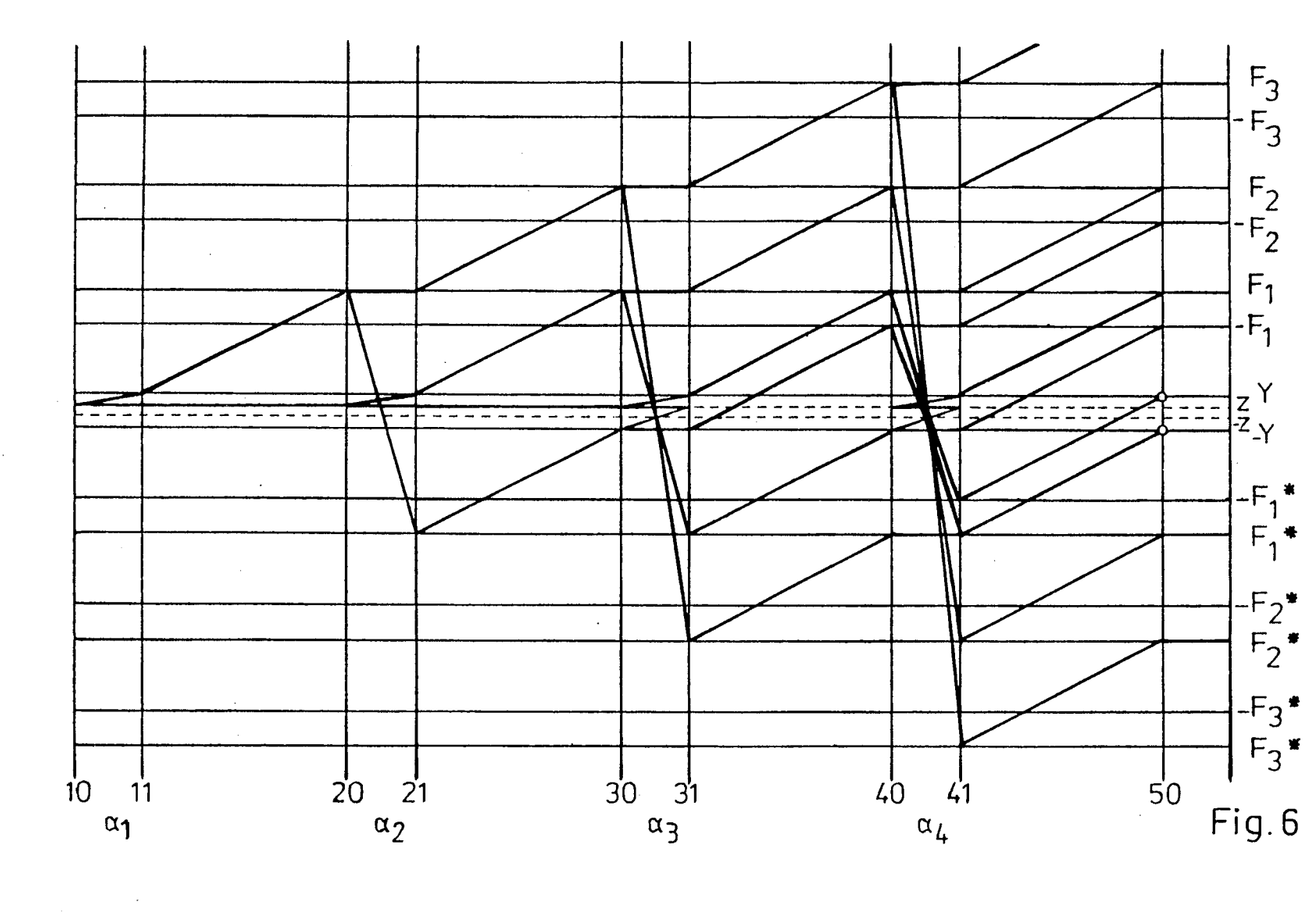
FIG. 6 represents a phase diagram of a spin system in accordance with the present invention.

The development over time between two rf pulses can be described as a transformation equation between such subensembles. Likewise, the effect of each rf pulse can be described by a transformation equation between such subensembles. The number of subensembles required for complete description of a sequence of rf pulses results from a phase diagram which covers all possibilities of development of the spin system and which is represented by FIG. 6. At the moment 10 before the first rf pulse, which is an x excitation pulse, the spin system is in a condition of pure z magnetization. The x excitation pulse causes a portion $\sin\alpha_1$ of the spin ensemble to be transferred into y magnetization, $\alpha_1$ being the flip angle of the first excitation pulse. The influence of the read gradient 3 (FIG. 1) causes this part of the spin system to be dephased so that it assumes the condition $F_1$ at the moment 20 before the second excitation pulse. Due to the described dephasing of the spin system, the vectorial sum of all spins of the subensemble $F_1$ is equal to 0. The next excitation pulse inverts a portion $\sin^2(\alpha/2)$ and transfers it into the condition $F_1^*$, which is the conjugate complex condition to $F_1$, which means that all x portions remain in $F_1$ while all y portions are inverted. Under the effect of the read gradient, these portions rephase to a magnetization in $-y$ direction, and are transferred by the next excitation pulse into z magnetization, with a probability corresponding to $\sin\alpha_3$. The portions of the magnetizations $F_n$ not seized by the excitation pulses develop, under the influence of the read gradient 3, to assume conditions of higher magnetization. At the same time, the influence of the excitation pulses upon the conditions $F_n$ results in the development of so-called coherent z magnetization which, during subsequent excitation pulses, leads to the formation of stimulated echoes. After termination of the sequence of n-equidistant excitation pulses (rf pulses), all conditions $F_n^*$ and $-F_n^*$ rephase to $-y$ and y magnetizations and, consequently, to echoes capable of being observed, the amplitude of the nth echo being equal to the quantity of spins $F_n^* - (-F_n^*)$, as the y and $-y$ portions compensate each other. It is possible in this manner to determine the amplitudes of all echo signals after n excitation pulses quantitatively by n matrix multiplication operations, which operations are possible without any difficulty even for several hundreds of rf pulses.

In addition to this quantitative determination, the diagram according to FIG. 6 lends itself also for relevant qualitative considerations. As has been mentioned before, the simultaneous formation of an y and a −y magnetization leads to a reduction in amplitude of the echo signals generated, due to the described vectorial addition. It will be realized from FIG. 6 that such a condition will be reached at the moment 50 at the earliest, and in fact this has been indicated by small circles. The condition y is obtained by double refocusing of the z magnetization, which had been excited at the moment 10, via $zy-F_1F^{1*}--y-y--F_1-F_1^*-y$, while the condition −y is obtained by simple refocusing of the magnetization excited by the third rf pulse (but also other magnetization portions). This means that a reduction in the amplitude of all those echo signals occurs which develop along a path comprising more than one refocusing process. Large flip angles increases the refocusing probability according to the formula $\sin^2(\alpha/2)$. This has the result that when large flip angles are used, such signals in phase opposition will be obtained already after a few echoes, and the amplitude of the echo signals will drop rapidly. In the case of small flip angles, in contrast, the total signal is determined by magnetizations which have been subjected to refocusing only once. Consequently, the amplitude of the echo signals will drop more slowly in this case.

For small flip angles, $\sin\alpha \approx \alpha$ and $\sin^2(\alpha/2) \approx \alpha^2/4$. The intensity of the echo signals is then determined by the number of possible paths on which refocusing occurs for the production of an echo. The first echo following the termination of the pulse burst is formed as the sum of the refocusing process of the (n−1)th rf pulse on the nth rf pulse, and of the (n−3)th rf pulse on the (n−1)th rf pulse, etc. The decay of amplitude of the echo signals can then be derived from the number of possible refocusing paths. Conversely, for rf pulses with different $\alpha_n$, an equation system can be developed which, when resolved, provides a set of flip angles $\alpha_n$ which will result in maximum uniformity in the drop of amplitude of the echo signals.

The formalism discussed in this connection can be extended also very easily to rf pulses which have been modulated relative to their phases. In this case, the phase diagram then has to be extended by the conditions $iF_n$, $-iF_n$, $iF_n^*$ and $-iF_n^*$ which are shifted in phase by 90°. The portion of the magnetizations in phase opposition, which leads to a reduction of the amplitudes of the echo signals, can then be reduced by phase-modulation of the flip angles so that the amplitudes of the echo signals will drop more slowly. For example, a modification of the pulse burst where the first half of the rf pulses is shifted in phase by 90° relative to the second half, will lead to an extension of the echo train.

To say it in somewhat different words, the total magnetization can be described, according to the generally accepted theory, by a vector B reflecting the distribution of the magnetizations to the components $M_x$, $M_y$ and $M_z$. In the state of thermal equilibrium, this vector is determined by $$B = \begin{pmatrix} 0 \\ 0 \\ 1 \end{pmatrix}$$

if the equilibrium magnetization coefficient is standardized to be 1. For the purpose of describing the development in time of the magnetization under the effect of a pulse burst it is necessary, as explained above, to divide B into a larger number of coefficients which reflect the frequency of the relevant conditions $F_1$, $F_1^*$, $Z_1$, $Z_1^*$, the conditions $Z_n$ representing the ensembles of coherent z magnetization corresponding to the conditions $F_n$, which lead to the formation of so-called stimulated echoes, as illustrated in FIG. 6. Correspondingly, B contains the coefficients of the ensembles $$M_x M_y M_z F_1 - F_1 F_1^* - F_1^* \ldots$$

The effect of each rf pulse having a flip angle $\alpha_n$ can be described by a matrix multiplication as follows:

$$B'_n - B_n = \begin{bmatrix} T_o & & & & & \\ & T_1 & & & & \\ & & T_1 & & & \\ & & & T_1 & & \\ & & & & T_1 & \\ & & & & & T_1 \end{bmatrix}$$

$B'_n$ defines the magnetization following the pulse, $B_n$ the magnetization before the rf pulse.

$T_0$ is the rotation matrix for an rf pulse of the phase x.

$$T_o = \begin{bmatrix} 1 & 0 & 0 \\ 0 & \cos \alpha_n & -\sin \alpha_n \\ 0 & \sin \alpha_n & \cos \alpha_n \end{bmatrix}$$

$T_1$ is the transformation matrix describing the transition of the dephased conditions $F_n$ . . . The coefficients are defined as follows:

$\cos^2(\alpha_n/2)$: for all transitions from $F_n$, $F_n^*$, $F_n$ and $-F_n^*$ among each other.

$\sin^2(\alpha_n/2)$: for the transitions from $F_n$ to $F_n^*$, from $-F_n$ to $F_n^*$, from $F_n^*$ to $-F_n$ and from $-F_n^*$ to $F_n$.

$\sin \alpha_n$: For the generation of the transversal ensembles $F_n$, $-F_n$, $F_n^*$ and $-F_n^*$ from the longitudinal conditions.

$\frac{1}{2}\sin\alpha_n$: For the generation of the longitudinal ensembles $Z_n$ and $-Z_n$ from each $F_n$, and correspondingly for all other conditions $-F_n$, $F_n^*$ and $-F_n^*$.

$\cos \alpha_n$: For the maintenance of each condition $Z_n$, $-Z_n$, $Z_n^*$, and $-Z_n^*$.

The transitions between the pulses appear from the diagram illustrated in FIG. 6. Repetitive application of this formalism leads to the coefficients $\pm F_n^*$ after termination of the pulse package, from which the amplitudes of the subsequent echoes $E_n$ are obtained by successive refocusing through the standing gradient b. This formalism can be extended easily for phase-modulated pulses, by the inclusion of the relevant conditions.

The above explanations have shown that the method according to the invention may be varied in the most different ways, in particular by the specific properties of the pulse burst whose rf pulses may have carrier signals of amplitudes and phases that may be varied in different ways and whose sequence of basically equidistant rf pulses may also comprise pulse gaps. Similarly, possible applications are opened up for the method according to the invention in all cases where the use of sequences of echo pulses with a coding impressed by a gradient field may prove to be useful. A particularly preferred application of the method according to the invention is seen in imaging techniques where the method according to the invention can be combined with all processes known from NMR tomography.

The method according to the invention can be carried out with the aid of all conventional NMR spectrometers and also in connection with nuclear spin tomographs, provided the transmitters of these units are capable of generating a rapid sequence of rf signals with predetermined amplitude variations and, under certain circumstances, also with predetermined variation of the phase of the rf carrier signal. The modifications required for this purpose to be made on conventional equipment can be carried out without any difficulty by any man skilled in the relevant art.

I claim:

1. A method for generating a sequence of spin echo signals in NMR Spectroscopy comprising the steps of placing a sample in a homogeneous magnetic field, additionally exposing said sample to a magnetic gradient field and exciting said sample by a sequence of equidistant rf pulse of different amplitude having a flip angle $\alpha$, said rf pulses following each other in rapid sequence, said flip angle $\alpha$ and amplitude being selected in such a manner that the product of the number of rf pulses and the flip angle of the individual pulses results in an overall flip angle of between 90 degrees and 180 degrees in order that, following said sequence of rf pulses, a train of equidistant echo signals of generally constant amplitude is obtained, said magnetic gradient field being held constant during excitation by the sequence of rf pulses.

2. A method according to claim 1, wherein the intensity of the magnetic gradient field is varied during a time interval between the sequence of rf pulses and the beginning of the echo signals.

3. A method according to claim 1 wherein a sequence of equidistant rf pulses is generated which are interrupted by gaps at predetermined points.

4. A method according to claim 1 for the generation of the signals characteristic of the points of a two-dimensional image in nuclear spin tomography, further comprising the steps of exposing the sample, after termination of the said sequence of rf pulses and for the duration of the said sequence of the echo signals, to a magnetic phase gradient directed perpendicularly to the said magnetic gradient field, and subjecting the echo signals so obtained to two-dimensional Fourier transformation in order to provide signals characteristic of the points of the image.

5. A method according to claim 4, wherein the phase gradient is constant during the sequence of the echo signals.

6. A method according to claim 4, wherein the said phase gradient is switched on in a pulse-like manner in the intervals between the individual echo signals.

7. A method according to claim 4, wherein the sample is subjected, before irradiation with the sequence of rf pulses, to a disk-selection gradient and a selective excitation pulse, in order that the sequence of the rf pulses will have the effect of a refocusing pulse.

8. A method according to claim 4, wherein the sample is subjected, prior to irradiation with the sequence of the rf pulses, to a disk-selection gradient and an rf pulse which saturated the area of the sample positioned outside the selected disk.

9. A method according to claim 4, wherein a disk-selective refocusing pulse in irradiated upon the sample after termination of the sequence of rf pulses and before the beginning of the sequence of echo pulses, and the magnetic gradient field is replaced by the selection gradient for the duration of the refocusing pulse.

10. A method according to claim 1 for the generation of the signals characteristic of the points of a two-dimensional image in nuclear spin tomography, further comprising the step of subjecting the sample to a disk-selection gradient and a selective excitation pulse for enabling the recording of a third dimension of the sample, said third dimension being perpendicular to the plane of the disk selection gradient.

11. A method for generating a sequence of spin echo signals in NMR Spectroscopy comprising the steps of placing a sample in a homogeneous magnetic field, additionally exposing said sample to a magnetic gradient field and exciting said sample by a sequence of equidistant rf pulses of different amplitude having a flip angle $\alpha$, said rf pulses being phase-modulated and following each other in rapid sequence, said flip angle $\alpha$ and amplitude being selected in such a manner that the product of the number of rf pulses and the flip angle of the individual pulses results in an overall flip angle of between 90 degrees and 180 degrees in order that, following said sequence of rf pulses a train of equidistant echo signals of generally constant amplitude is obtained.

12. A method according to claim 11, wherein the phase of a first half of the rf pulses is phase-shifted by 90 degrees relative to the phase of a second half of the rf pulses.

13. A device for generating a sequence of spin echo signals in NMR spectroscopy comprising:
means for applying a homogeneous magnetic field to a sample;
means for applying a constant magnetic gradient field to said sample during exposure thereof to rf pulses;
transmitter means for generating rf pulses and disposed for exposing said sample to the rf pulses, said transmitter means being adapted for generating a rapid sequence of equidistant rf pulses with different amplitudes each having a flip angle $\alpha$, said amplitudes and flip angles $\alpha$ being selected such that the product of the number of rf pulses and the flip angle is between 90 degrees and 180 degrees.

* * * * *